United States Patent [19]
Suzuki et al.

[11] Patent Number: 5,740,121
[45] Date of Patent: Apr. 14, 1998

[54] SYNCHRONOUS-TYPE MEMORY

[75] Inventors: Azuma Suzuki, Tokyo; Hatsuhiro Kato, Hakodate, both of Japan

[73] Assignee: Kabushiki Kaisha Toshiba, Kawasaki, Japan

[21] Appl. No.: 730,211

[22] Filed: Oct. 15, 1996

Related U.S. Application Data

[63] Continuation of Ser. No. 357,289, Dec. 13, 1994, abandoned.

[30] Foreign Application Priority Data

Dec. 13, 1993 [JP] Japan ..................... 5-312105

[51] Int. Cl.$^6$ ..................................... G11C 7/00
[52] U.S. Cl. ........................ 365/233; 365/230.06
[58] Field of Search .................. 365/233, 230.06, 365/189.01

[56] References Cited

U.S. PATENT DOCUMENTS 5,394,373  2/1995  Kawamoto ................. 365/233 X
5,400,282  3/1995  Suzuki et al. .............. 365/233 X
5,408,438  4/1995  Tanaka et al. ............. 365/233 X

*Primary Examiner*—Do Hyun Yoo
*Attorney, Agent, or Firm*—Foley and Lardner

[57] ABSTRACT

A synchronous-type memory performing in synchronization with a clock provided from an external device. This memory includes memory cells for storing data and selected by one of word lines, a decoder and a S/A. The decoder latches an address to select a word line in accordance with a rising edge of the clock, selecting a word line, and deselecting all word lines in accordance with a falling edge of the clock. The S/A stores the data transferred from the memory cell belonged to the word line selected by the decoder in synchronism with the rising edge of the clock before all the word lines is switched by the decoder to a deselected state, synchronized with the falling edge of the clock.

11 Claims, 11 Drawing Sheets

SYNCHRONOUS-TYPE MEMORY

This application is a continuation of application Ser. No. 08/357,289, filed Dec. 13, 1994, now abandoned.

BACKGROUND OF THE INVENTION

1. Field of the Invention

The present invention relates to a synchronous-type memory accessed in synchronism with a clock signal, and, in particular, to a synchronous-type memory which is a static-type random access memory (SRAM) with high speed access.

2. Description of the Prior Art

A conventional synchronous-type memory from which and to which data is read out and written in synchronism with a clock signal has, for example, a configuration such as that shown in FIG. 1.

The synchronous-type memory in FIG. 1 comprises an address buffer 101 for receiving an address signal from external devices, a first partial decoder 102, a second partial decoder 103, and a main decoder 104 for decoding an address signal and selecting data to be accessed, a cell group 105 for storing access data, first and second sense amplifiers 106 and a third sense amplifier 107 for sense-amplification of data read out from the cell group 105, an output buffer 108 for transmitting the read-out sense-amplified data, a write-in circuit 109 for writing data into the cell group 105, and a clock buffer 110 for receiving a clock signal from external devices and supplying internal clock signals CK1B, CK2B, CK3B, CK4B, and CK5B (for instance, the character "B" in a clock "CKB" designates an inverted state or a reverse state of clock "CK", hereinafter, we will use this character "B" for the same meaning.) having the same phase as that clock signal, and internal clock signals CK1, CK2, CK3, CK4, and CK5 having a phase which is the reverse of that clock signal, to the first partial decoder 102, the second partial decoder 103, the output buffer 108, and the write-in circuit 109 respectively.

With this type of configuration, address signals and read-out data are stored in a synchronous-type memory based on a register/register (R/R) method, specifically, wherein the first partial decoder 102 is formed as a latch circuit, for example, as shown in FIG. 2, the second partial decoder 103 is formed as a latch circuit, for example, as shown in FIG. 3, the third sense amplifier 107 is formed as a combination of the latch circuit as shown in FIG. 2 and the latch circuit as shown in FIG. 3. The memory in which each of the decoders and the sense amplifiers has a register to store an address signal and read-out data is performed based on a timing chart shown in FIG. 5.

When there are many inputs (multiple inputs) to the latch circuits shown in FIGS. 2 and 3, a clocked NAND circuit shown in FIG. 4 can be used.

In the timing chart shown in FIG. 5, in a read-out cycle of cycle (1), a read-out address (Rd, Add1) is transmitted to the first partial decoder 102 at the rising edge (timing t51) of a clock signal CK. At this time, the input address is stored in the first partial decoder 102. The address signal stored in the first partial decoder 102 is provided to the main decoder 104 through the second partial decoder 103. Simultaneously with the selection by the main decoder 104 of, for example, a section word line SWL2 of the section word line including a predetermined number of word lines, the section word line SWL1 is not selected.

Data is read out from a cell connected to the selected section word line SWL2, sense-amplified by a sense amplifier, and then output to a bit line pair BL, BLB. At this time, the data read out in the previous cycle is stored in the cycle (1) because a register is provided in the third sense amplifier.

As shown in FIG. 5, a read-out data (RdData1) read-out by the address data (RdAdd1) obtained in the cycle (1) becomes valid at the timing t54 in the cycle (2) in synchronism with the rising edge (timing t53) of the clock signal.

Next, when the input-pins are commonly used for the readout operation and the write-in operation, during the switch from the read-out operation to the write-in operation, dead cycles (2) and (3) are inserted between the two operations, for example, between cycle (1) and cycle (4) as shown in FIG. 5 in order to prevent interference between the read-out data and the written-in data.

Subsequently, a write-in address signal (WrAdd4) becomes effective in synchronism with the rising edge of the clock signal CK at a cycle (4), and data is written into a memory cell in the memory cell group 105 corresponding to the write-in address signal (WrAdd4) latched through a write-in circuit 109.

As opposed to this, in a synchronous-type memory based on a register/latch (R/L) method wherein the first and second partial decoders 102, 103 are formed from the latch circuit shown in FIG. 2, the third sense amplifier is formed from the latch circuit shown in FIG. 3, and the address signal is latched and the data is read out in a same cycle or one cycle, the data is stored until new data is read out in the next cycle and the access operation is performed in accordance with, for example, the timing chart shown in FIG. 6.

In FIG. 6, the operation up to the read-out of the data by the second sense amplifier 106 is the same as for the register/register (R/R) method described above, as shown in FIG. 5.

The read-out data is sense-amplified (timing t64) by the third sense amplifier 107 in synchronism with the falling edge (timing t63) of the clock signal CK in the cycle (1).

The read-out data is latched in the third sense amplifier 107 in synchronism with the rising edge (timing t65) of the clock signal CK in the cycle (2), and this read-out data is stored until the edge of the clock signal CK is fallen (timing t66) in the cycle (2).

In this type of conventional register/register (R/R) method or the register/latch (R/L) method, the main decoder 104 for controlling selection of the word line has a configuration, for example, as shown in FIG. 7.

In FIG. 7, because there is an extremely heavy load on a main decoder 104 for driving a plurality of section word line drivers (omitted from FIG. 7), the output stage of the main decoder 104 is formed from a bipolar transistor 111 and a N-channel FET (field effect transistor) 112. In this configuration of the main decoder 104, a main word line MWL connected to the point of connection for these two elements 111 and 112 is charged by the bipolar transistor 111 in order to disconnect the main word line MWL. The main word line MWL is discharged by the FET 112 in order to select the main word line MWL.

This type of the main decoder 104 is extremely effective in obtaining the word line drive force when the memory is operated by a low power source voltage.

However, a difference is produced in the drive force of the bipolar transistor 111 and the FET 112 when these two elements are to be formed at the output stage in the limited occupied area without causing an increase in the chip area. For this reason, the speed of change differs for both the case wherein the word line is changed from the selected state to the deselected state and the case wherein the word line is changed from the deselected state to the selected state. As a result, there is concern that a temporary duplication will occur in the selection of the word line. This can cause erroneous operation and delayed access.

In a conventional synchronous-type semiconductor memory device such as a synchronous-type memory based on the R/R method and R/L method, when an effective address data is obtained, a word line to be used is selected at the same time that a word line to be not used is disconnected. In FIG. 5 (a synchronous-type memory based on the R/R method), the section word line SWL1 is selected and the section word line SWL2 is not selected at the timing t51. The section word line SWL1 is not selected and the section word line SWL2 is selected at the timing t52. In FIG. 6 (synchronous type memory based on the R/L method), the section word line SWL1 is selected and the section word line SWL2 is not selected at the timing t61. The section word line SWL1 is not selected and the section word line SWL2 is selected at the timing t62.

When the operation speed of the bipolar transistor 111 is different from that of the NMOS FET 112, as shown in FIG. 7, for example, the operation speed of the NMOS transistor 112 is lower than that of the bipolar transistor 111, the rising edge of the level of the section word line SWL2 is delayed. In this case, at the timing t62, both of the section word lines SWL1 and SWL2 are selected. This causes an error operation. This is a problem.

In addition, in the write-in operation, as shown in FIG. 5, it is necessary for the write-in to wait until the section word line SWL is effective (until the timing t55 shown in FIG. 5). Therefore an inferior write-in is produced when the synchronism (cycle period or cycle time) is shortened.

As can be seen from the foregoing explanation, in a conventional synchronous-type memory, an output stage made up of a bipolar transistor and an FET has been adopted for the decoder to drive a high load word line in order to satisfy the requirements for both a low power source voltage operation to provide low power consumption and a high speed operation.

However, in the case of an output stage formed from a bipolar transistor and an FET, a difference is produced in the drive force or drive ability for two elements, the bipolar transistor and the NMOS FET formed with a limited occupied area, and adverse conditions are caused whereby there is a tendency toward erroneous operation and delayed access.

SUMMARY OF THE INVENTION

Accordingly, an object of the present invention is, with due consideration to the drawbacks of such conventional synchronous-type memories, to provide a synchronous-type memory wherein duplicate selection of a word line is prevented, high speed operation is achieved in a small structure, even at a low power source voltage, and there is no inferior write-in produced at high speed.

In accordance with a preferred embodiment of the present invention, a synchronous-type memory performing in synchronization with a clock signal provided from an external device, comprises:

a plurality of memory cells for storing data, and selected by one of word lines;

decoder means for latching an address signal in order to select one of said word lines in accordance with a first edge of said clock signal, selecting said word line, and deselecting all said word lines in accordance with a second edge of said clock signal;

store means for storing said data transferred from said memory cell belonged to said word line selected by said decoder means in synchronism with said first edge of said clock signal before all said word lines being switched by the decoder means to a deselected state, synchronized with the second edge of said clock signal.

In the synchronous-type memory described above, said decoder means comprises a bipolar transistor located between a high level power source and an output terminal, and a field effect transistor (FET) connected between a lower level power source and said output terminal, wherein said decoder means selects one of said word lines corresponding to said address signal by means of said bipolar transistor, and deselects said selected word line in synchronism with the first edge of said clock signal.

In the synchronous-type memory described above, said first edge is a rising edge of said clock signal and said second edge is a falling edge of said clock signal.

The synchronous-type memory described above, further comprises divider means for receiving said clock signal and generating an internal clock signal, wherein said decoder means and said sense amplifier means operate in synchronism with said internal clock signal.

In accordance with another preferred embodiment of the present invention, a synchronous-type memory performing in synchronization with a clock signal provided from an external device, comprises:

a plurality of memory cells for storing data, and selected by one of word lines;

decoder means for latching an address signal in order to select one of said word lines in accordance with a first rising edge of said clock signal, selecting said word line, and deselecting all said word lines in accordance with a second rising edge of said clock signal;

store means for storing said data transferred from said memory cell belonged to said word line selected by said decoder means in synchronism with said first rising edge of said clock signal before all said word lines being switched by the decoder means to a deselected state, synchronized with the second rising edge of said clock signal.

In the synchronous-type memory described above, data of said memory cells is transferred to/from through one of a plurality of bit lines, and said data for a write-in operation is transmitted on said bit line in a cycle after a read-out operation cycle and before a write-in operation cycle in synchronization with said clock signal.

In the synchronous-type memory described above, said store means is formed by a senseamplifier.

BRIEF DESCRIPTION OF THE DRAWINGS

These and other objects, features, and advantages of the present invention will become more apparent from the following description of the preferred embodiments taken in conjunction with the accompanying drawings, in which.

DETAILED DESCRIPTION OF THE PREFERRED EMBODIMENTS

Other features of this invention will become apparent in the course of the following description of exemplary embodiments which are given for illustration of the invention and are not intended to be limiting thereof.

Embodiments of the present invention will now be explained with reference to the drawings.

Figure 1:
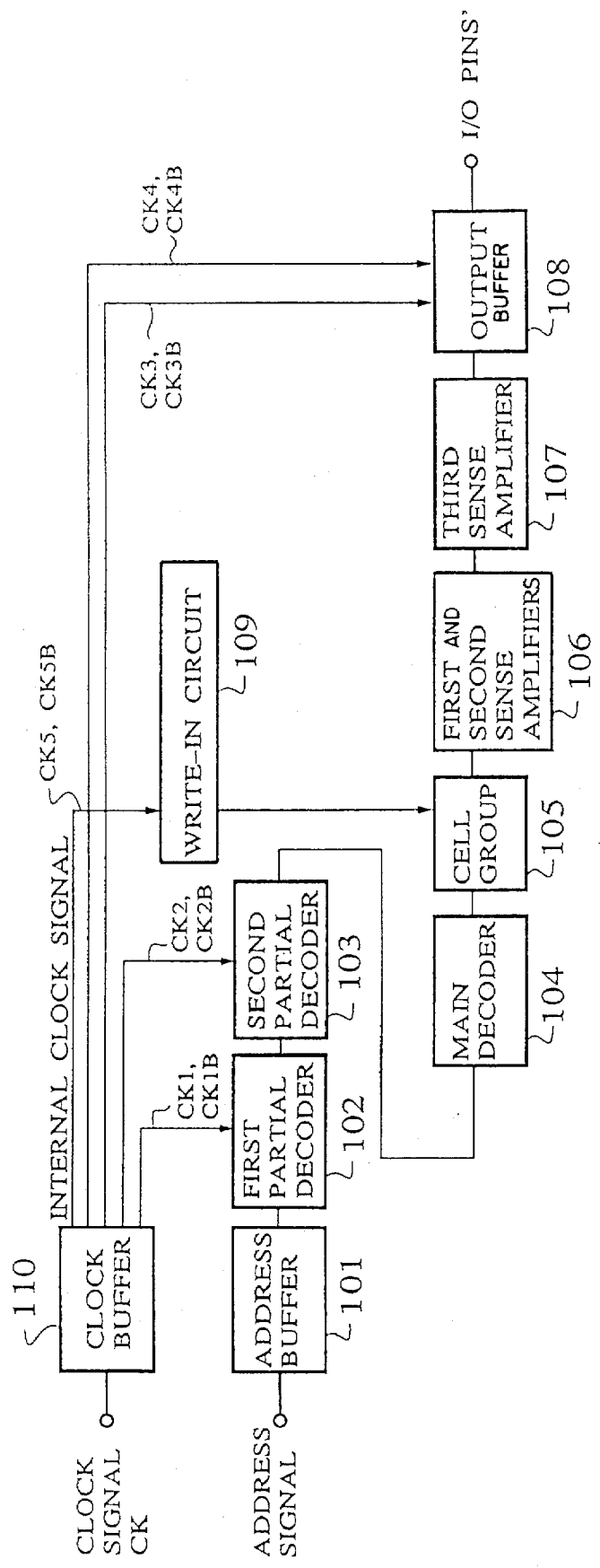
FIG. 1 is a configuration diagram of a conventional synchronous-type memory.
Figure 2:
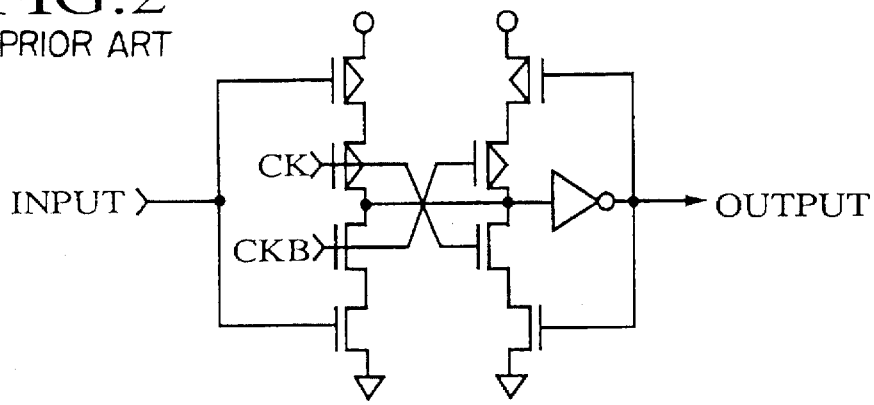
FIG. 2 is a diagram showing one example of a configuration of a latch circuit used in the synchronous-type memory illustrated in FIG. 1.
Figure 3:
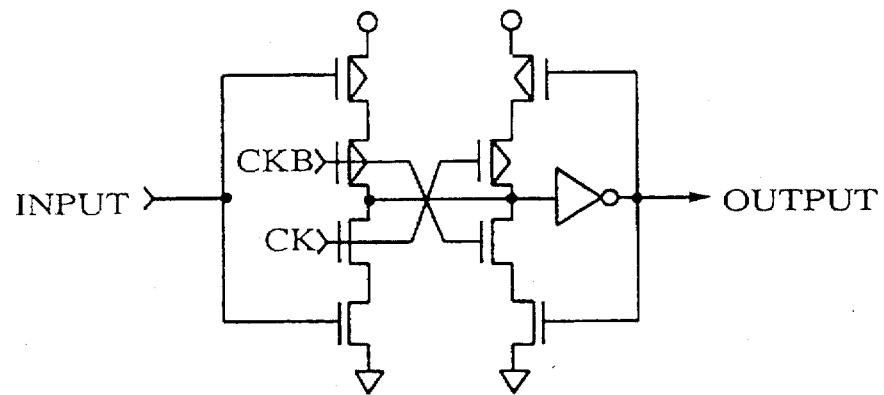
FIG. 3 is a diagram showing another example of a configuration of a latch circuit used in the synchronous-type memory illustrated in FIG. 1.
Figure 4:
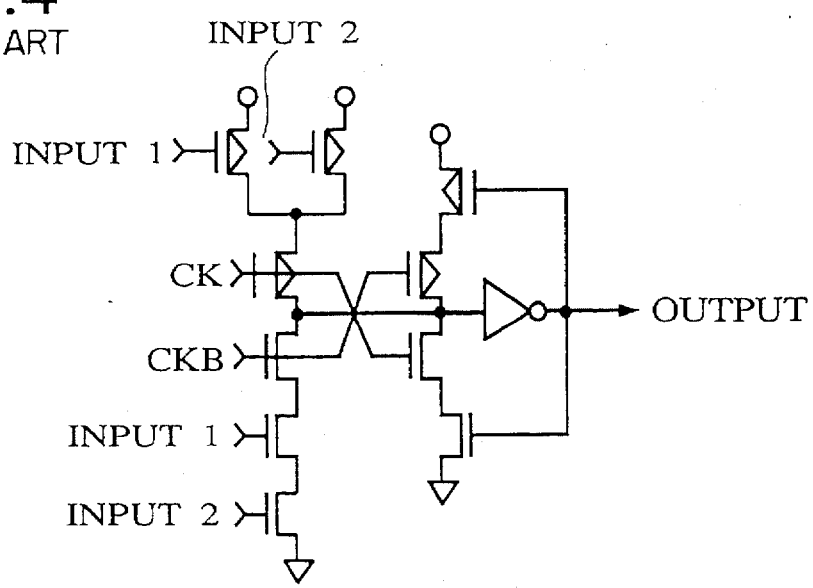
FIG. 4 is a diagram showing yet another example of a configuration of a latch circuit used in the synchronous-type memory illustrated in FIG. 1.
Figure 5:
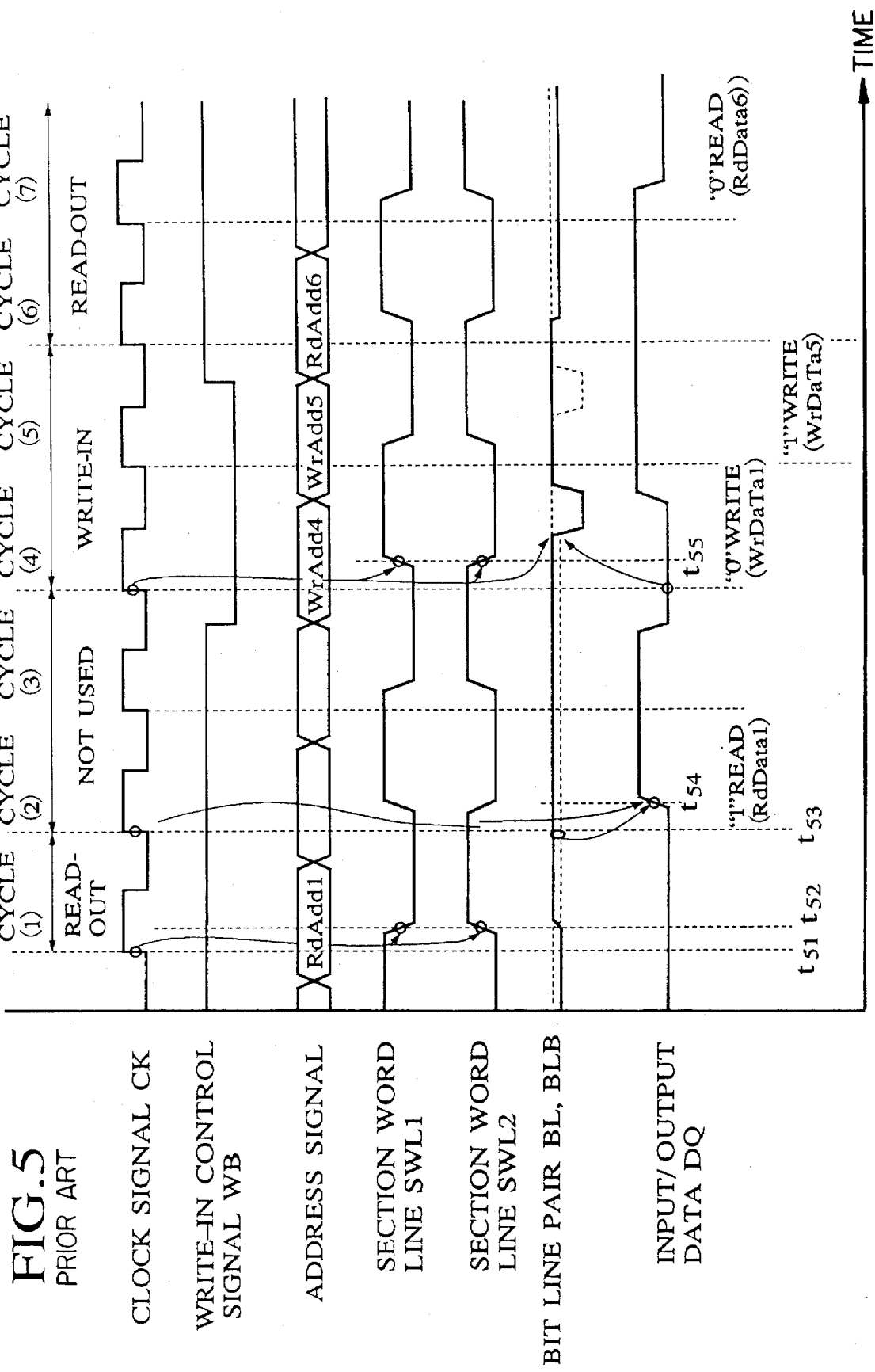
FIG. 5 is an operation timing chart for a register/register method (R/R method) for the synchronous-type memory illustrated in FIG. 1.
Figure 6:
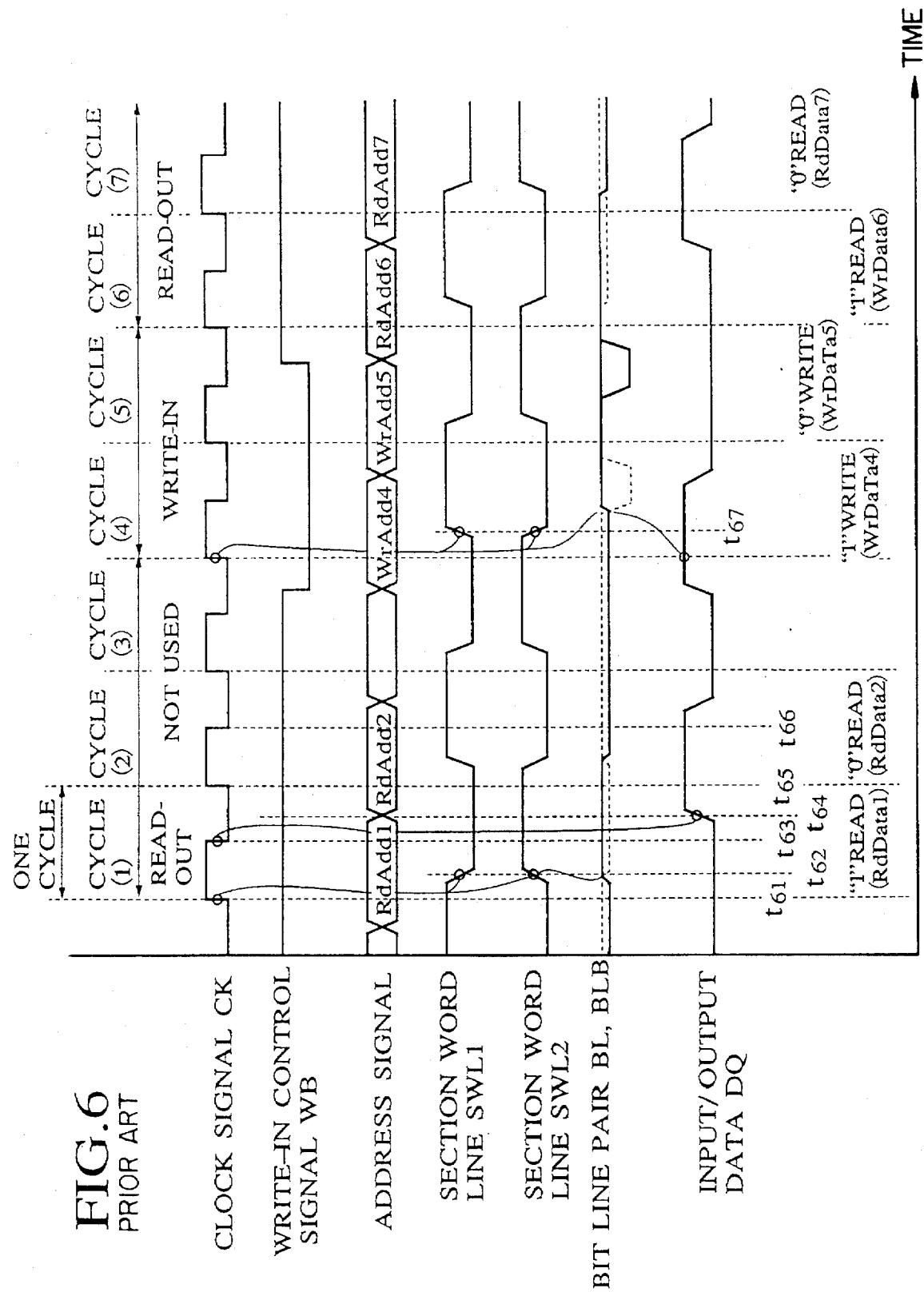
FIG. 6 is an operation timing chart for a register/latch method (R/L method) for the synchronous-type memory illustrated in FIG. 1.
Figure 7:
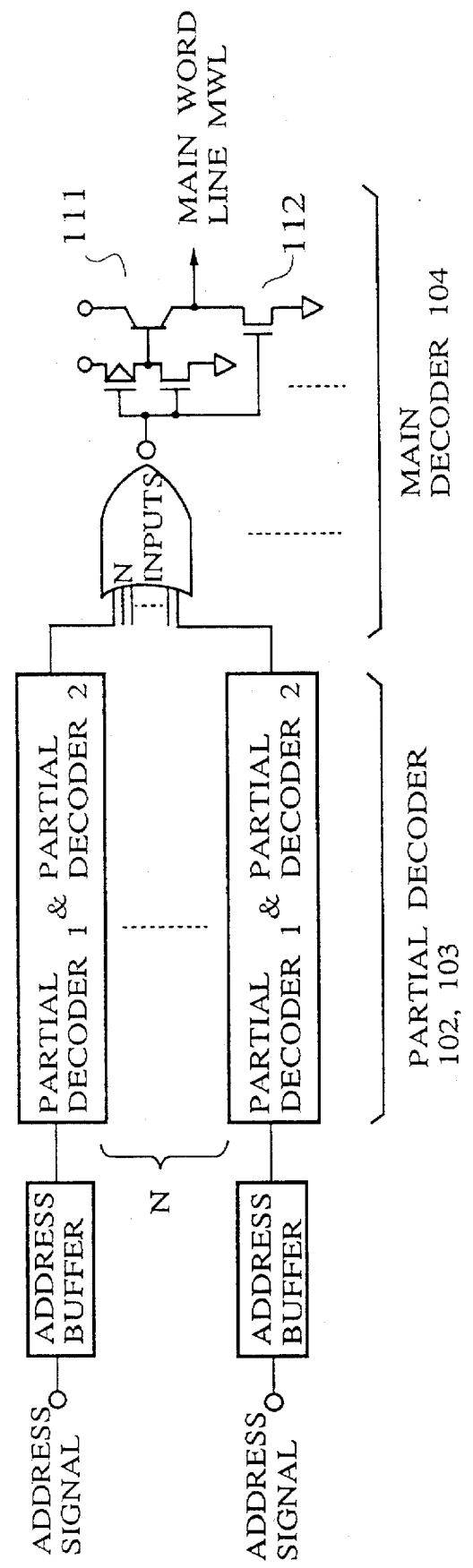
FIG. 7 is a configuration diagram of a decoder illustrated in FIG. 1.
Figure 8:
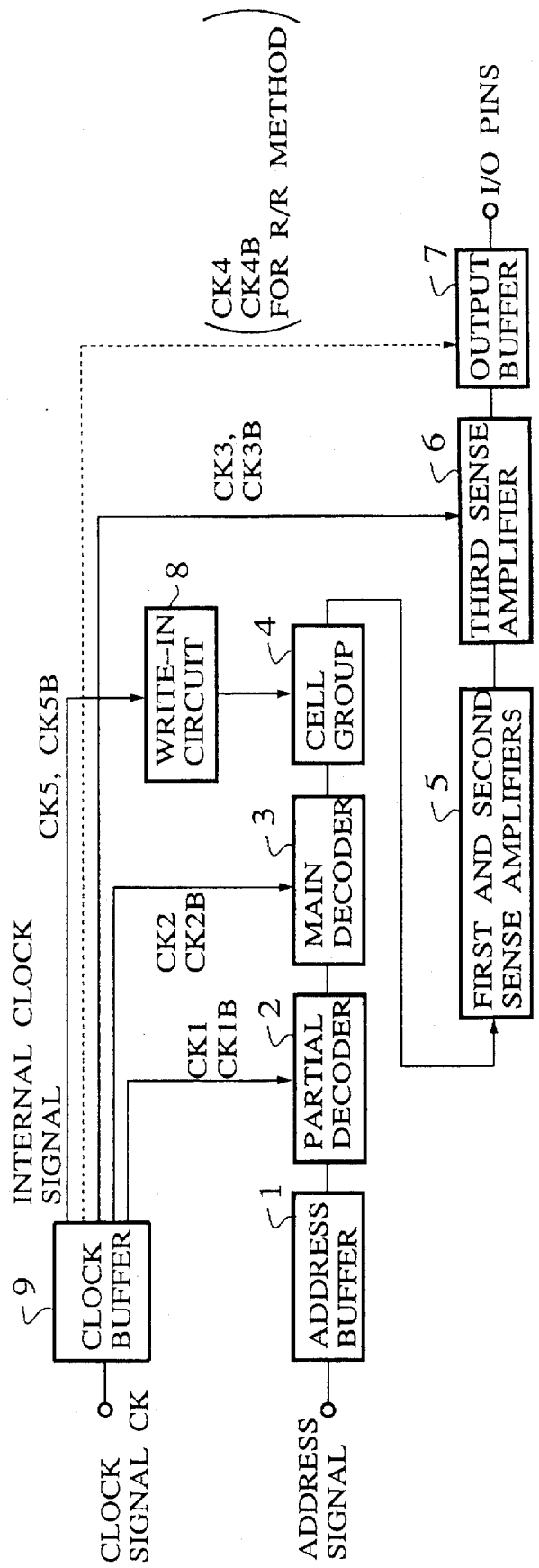
FIG. 8 is a general configuration diagram of synchronous-type memories according to embodiments of the present invention.

FIG. 8 is a configuration diagram of a first embodiment of a synchronous-type memory based on the Register method (R/R method) of the present invention.

The synchronous-type memory in FIG. 8 comprises an address buffer 1 for receiving an external address signal, a partial decoder 2 and a main decoder 3 for decoding an address signal and controlling the selection of a word line, a cell group 4 for storing data, first and second sense amplifiers 5 and a third sense amplifier 6 for sense-amplification of data read out from the cell group 4, an output buffer 7 for transmitting the read-out data to an external device, a write-in circuit 8 for writing data into the cell group 4, and a clock buffer 9 for receiving a clock signal CK from an external device, creating internal clock signals CK1, CK3, and CK5 of the same phase as the clock signal CK, and internal clock signals CK2B, CK3B, and CK5B of a phase which is the reverse of that of the clock signal CK, and supplying the internal clock signal CK1 to the partial decoder 2, the internal clock signal CK2B to the main decoder 3, the internal clock signals CK3, CK3B to the third sense amplifier 6, and the internal clock signals CK5, CK5B to the write-in circuit 8. Only after the address becomes valid, a read-out operation or a write-in operation is performed for the data within one cycle of the clock signal CK.

In the configuration of the synchronous-type memory shown in FIG. 8, when this memory is performed based on the R/R method, the clock signals CL4 and CL4B are required for the output buffer 7 (designated by dotted line in FIG. 8).

Figure 9:
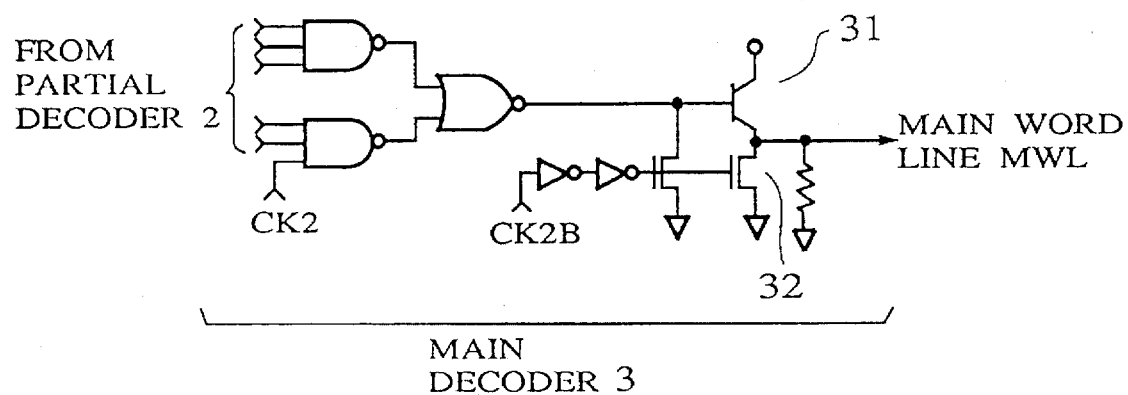
FIG. 9 is a configuration diagram of a main decoder shown in FIG. 8.

FIG. 9 is a diagram illustrating one specific configuration for the main decoder 3 shown in FIG. 8.

In FIG. 9, the front section of the main decoder 3 is formed by logic gates for latching an address signal synchronized with the rising edge of the internal clock signal CK. The back section of the main decoder 3 is formed with a bipolar transistor 31, the ON state of which is controlled by the output of from the partial decoder 2, and an output stage for driving a main word line MWL by a switching operation of an N-channel FET 32, of which the ON state is controlled by the internal clock signal CK2B.

In this type of configuration, when the internal clock signal CK1 synchronized with the rising edge of the internal clock signal CK is at the high level and the internal clock signal CK2 is at the low level, the bipolar transistor 31 of the main decoder 3 is in the ON state and the FET 32 is in the OFF state in the decoder for selecting the main word line MWL.

The main word line MWL reaches the high level at high speed, charged by the bipolar transistor 31 and is selected.

The internal clock signal CK1 reaches the low level synchronized with the falling edge of the internal clock signal CK, the internal clock signal CK2B is at the high level, the bipolar transistor 31 is in the OFF state, the FET 32 is in the ON state. The main word line MWL is discharged by the FET 32, reaches the low level comparatively slowly and is in a deselected state.

In this manner, this decoder selects the main word line MWL synchronized with the rising edge of the clock signal CK, and the main word line MWL is in the deselected state, synchronized with the falling edge of the clock signal, unrelated to the address signal.

Figure 10:
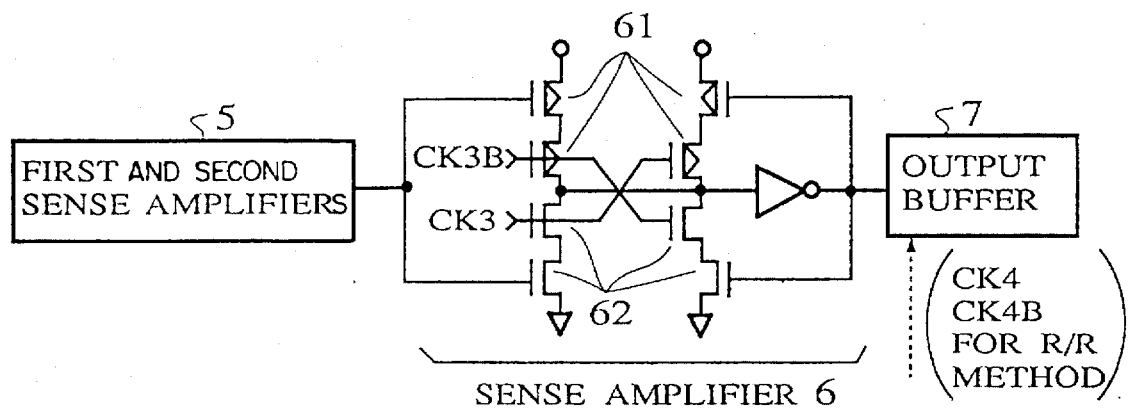
FIG. 10 is a configuration diagram of a third sense amplifier shown in FIG. 8.

FIG. 10 is a diagram illustrating a specific configuration of the third sense amplifier 6 shown in FIG. 8.

In FIG. 10, the third sense amplifier 6 comprises a P-channel FET 61 and an N-channel FET 62. When the internal clock signal CK3 is at the high level and the internal clock signal CK3B is at the low level, the output of the first and second sense amplifiers 5 is received, and the read-out data is latched into the sense amplifier 6. When the internal clock signal CK3 is at the low level and the internal clock signal CK3B is at the high level, the data stored in the third sense amplifier 6 until that time is sense-amplified and is output to the output buffer 7. The read-out data is then latched and stored. When the synchronous-type memory is formed based on the R/R method, the clock CK4, CK4B are required designated by a dotted line for the output buffer 7.

Next, the operation in the above-mentioned configuration will be explained with reference to the operational timing chart shown in FIG. 11.

Figure 11:
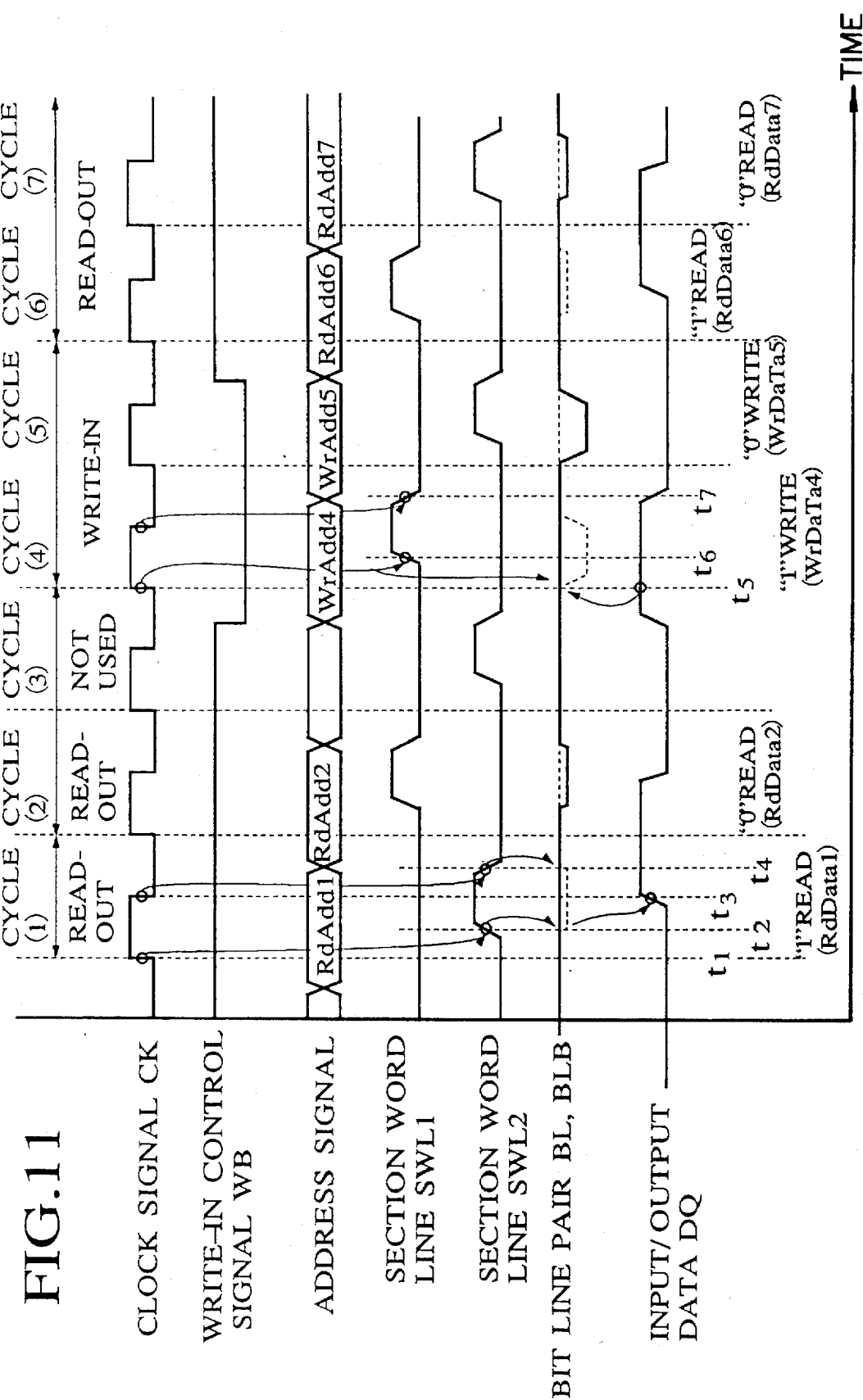
FIG. 11 is an operation timing chart for a synchronous-type memory based on the R/L method as the first embodiment of the present invention.

In FIG. 11, cycles 1, 2, 6, and 7 or the externally-provided clock signal CK are read-out cycles, cycle 3 is a dead cycle, and cycles 4 and 5 are write-in cycles.

First, in cycle 1, a read-out address signal (RdADD1) synchronized with the rising edge (timing t1) of the clock signal CK is received and latched. For example, a section word line SWL2 becomes the high level (timing t2) in order to select a cell, and the data in the cell is read out. The read-out data is sensed and amplified by the first and second sense amplifiers 5 and then provided to the third sense amplifier 6.

When the clock signal CK in the cycle 1 is at the high level, the third sense amplifier 6 further amplifies the readout data which has been sense-amplified by the first and second sense amplifiers 5 and provides it to the output buffer 7. The read-out data is then transmitted to an external device via the output buffer 7.

Next, when the clock signal CK in the cycle 1 drops (timing t3), the section word line SWL2 is selected in synchronization with the falling edge of the clock signal CK, goes to the low level (timing t4) and is deselected. As a result, the state of the deselected section word lines (for example, the section word line SWL1 shown in FIG. 11) up to this time is maintained, and, because these section word lines are deselected, all the section word lines are deselected. In addition, the read-out data which has been sense-amplified up to this time is latched by the third sense amplifier 6 and stored.

Accordingly, all the section word lines are deselected, all the cells are in the deselected state, and the effective (or valid) data is stored by the third sense amplifier 6, even in the state where the data is not read out.

Next, in the cycle 2 of the clock signal CK, the data is read out in the same manner as in the cycle 1.

Subsequently, in the cycle 4, a write-in address signal (WrADD4) is received and latched, synchronized with the rising edge (timing 5) of the clock signal CK. For example, the section word line SWL1 is selected in order to select one cell. Write-in (input) data transmitted to a bit line pair BL and BLB is written into the selected cell via the write-in circuit 8.

In this type of write-in operation, all the section word lines SWL are in the deselected state at the rising edge (timing t5) of the write cycle 4 of the clock signal CK, therefore even if the write-in address signal is not latched and is provided to the bit line pair BL and BLB via the write-in circuit 8, no erroneous write-ins are produced.

As opposed to this embodiment, in a conventional R/L method wherein selected and deselected word lines occur simultaneously, the word line to be selected is at the low level, and it is not possible for the write-in data to be input until this word line is deselected.

Accordingly, in this embodiment, in the write-in cycle synchronized with the rising edge of the clock signal CK it is possible to provide write-in data to the highly loaded bit line pair BL, BLB without waiting for the selection of the section word line SWL. The write-in operation can therefore be carried out at high speed. This is an important feature of the synchronous-type memory based on the R/L method according to the first embodiment of the present invention. This feature of the present invention can be applied to a synchronous-type memory based on the R/R method.

Because the write-in operation can be completed in the first half (cycle 4) of the write-in cycle (cycle 4 and cycle 5), the bit line pair BL and BLB can be satisfactorily precharged up to the commencement of the next read-out cycle (cycle 6 and 7) so that no delay is produced in the read-out operation. As opposed to this, in the conventional R/L method the write-in operation is performed until a time directly prior to the read-out cycle so that it is difficult to adequately precharge the bit line pair BL and BLB, and the next read-out operation is delayed.

In addition, in one cycle of the read-out operation and in one cycle of the write-in operation based on the R/L method, after one section word line SWL is selected in a specified time, synchronized with the rising edge of the internal clock signal CK, all the section word lines SWL are in the deselected state, synchronized with the falling edge of the internal clock signal CK. Until the next cycle is commenced, all the section word lines SWL are in the deselected state so that temporary duplicate selection of the word lines when the address signal is changed is prevented. There is on therefore no erroneous operation and no delay is produced in the access time. This is important feature of the present invention.

In addition, it is not necessary to set the drive ability for selecting the setting of the section word lines SWL at the high level and the drive force for non-selection at the low level to carry out the individual timing when the section word lines SWL are selected and deselected. Accordingly, as shown in FIG. 9, in the case where the decoder output stage comprises a bipolar transistor and an FET, it is unnecessary to set the drive force of the FET to the same drive force as the bipolar transistor. Therefore, the occupied area of the FET in a memory can be small. Furthermore, because the main decoder 3 does not operate the FET 32, the gate volume for driving the main decoder 3 is small, and it is possible to provide a decoder with a fast access time and a small size by reducing the first stage of the output stage.

In addition, all the section word lines SWL in the second half of one cycle during the read-out operation and the write-in operation are in the deselected state (or are not selected), and the bit line pair BL and BLB are precharged in order to initialize them until the next cycle commences.

For example, in the case where the data in a negative phase is read-out from the same bit line pair BL and BLB, it is not necessary to reverse the potential of the bit line pair BL and BLB during a read-out operation cycle.

Accordingly, the read-out operation can be performed at high speed.

Figure 12:
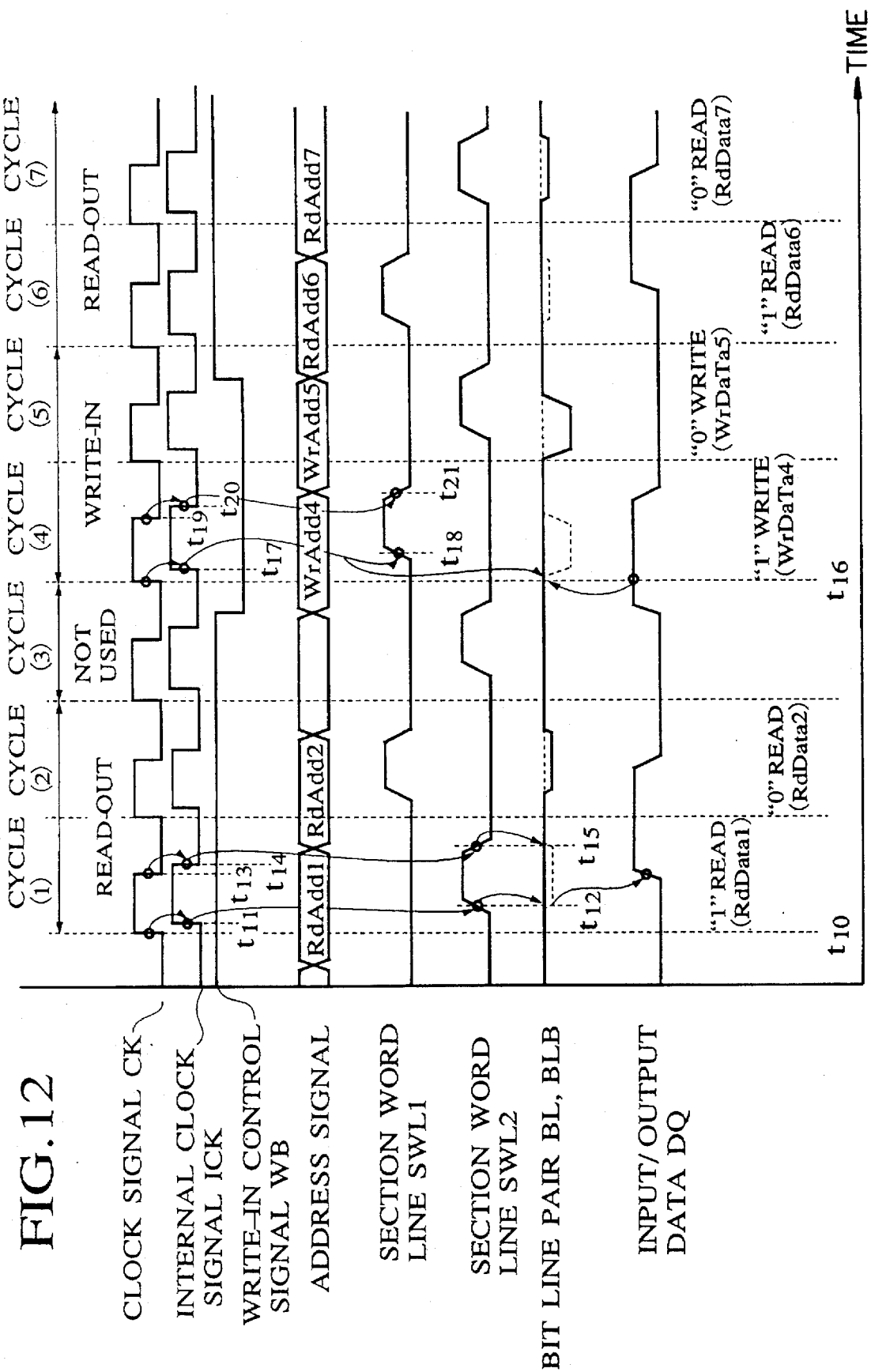
FIG. 12 is an operation timing chart for a synchronous-type memory based on the R/L method as the second embodiment of the present invention.

The present invention is not limited to the above-described first embodiment. FIG. 12 is a operation timing chart of a synchronous-type memory based on the R/L method according to the second embodiment of the present invention.

As shown by the operational timing chart in FIG. 12, the same effect can also be obtained by using an internal clock signal ICK generated based on a clock signal CK provided from an external device. This internal clock signal ICK can be generated by using a conventional divider (not shown). For example, even if an synchronous-type memory of the present invention is operated in synchronism with a rising edge and a falling edge of the internal clock signal ICK produced internally based on the clock signal CK. In this case, it may be permitted to delay the period of the internal clock signal ICK to the period of the internal clock CK.

In FIG. 12, the section word line SWL2 is selected at timing t12 and deselected at timing t15 in a read-out operation. In this case, timing t12 is delayed from timing t12 which is the rising edge of the internal clock signal ICK. Timing t15 is delayed from timing t14 which is the falling edge of the internal clock signal ICK.

Similar to the above read-out operation, the section word line SWL1 is selected at timing t18 and deselected at timing t21 in a write-in operation. In this case, timing t18 is delayed from timing t17 which is the rising edge of the internal clock signal ICK. Timing t121 is delayed from timing t20 which is the falling edge of the internal clock signal ICK.

Figure 13:
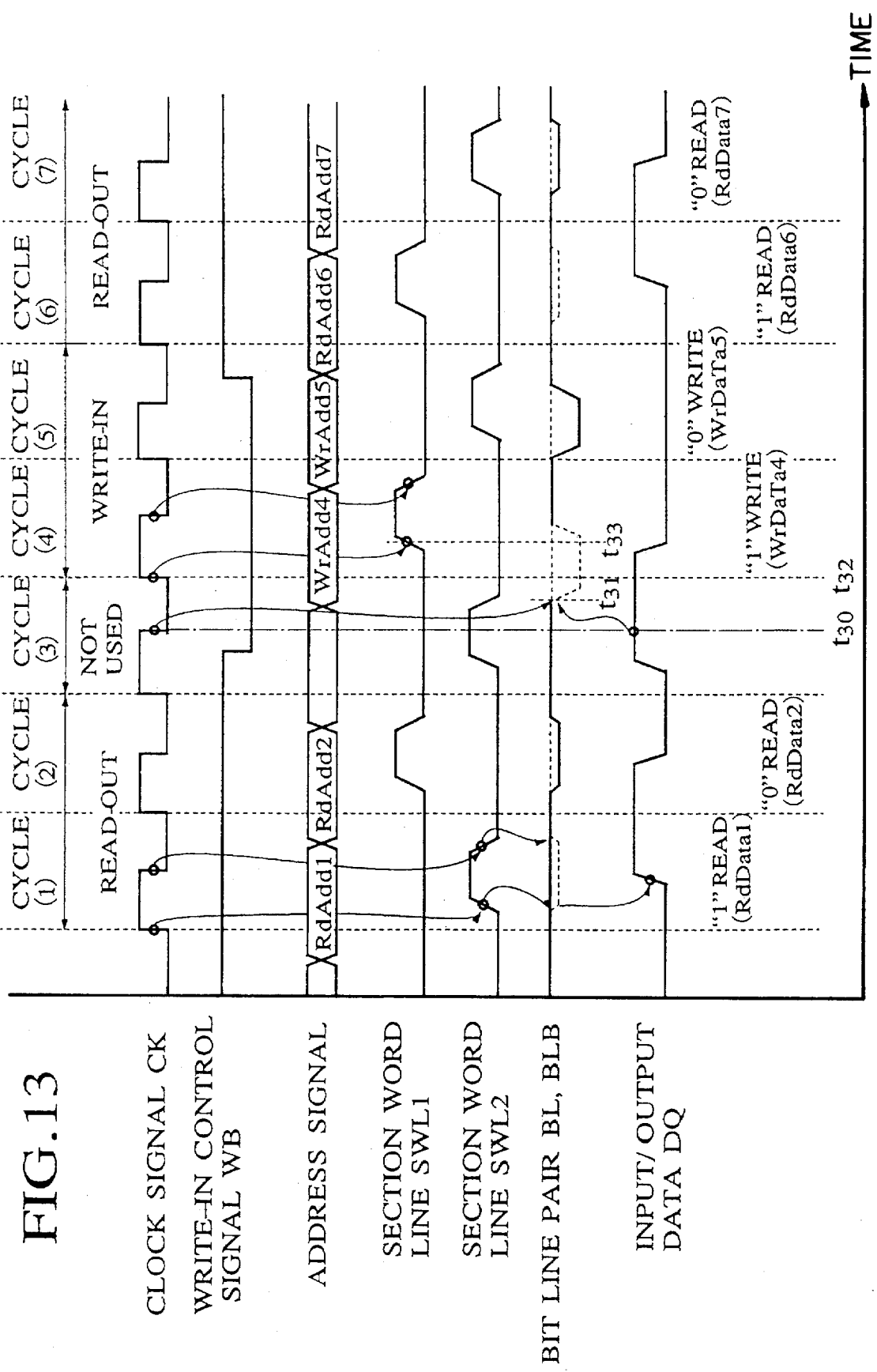
FIG. 13 is an operation timing chart for a synchronous-type memory based on the R/L method as the third embodiment of the present invention.

The present invention is not limited to the above-described first and second embodiments. FIG. 13 is a operation timing chart of a synchronous-type memory based on the R/L method according to the third embodiment of the present invention.

In general, in a synchronous-type memory based on the R/L method and the R/R method, there is unused cycle between a read-out operation and a write-in operation or a write-in operation and a read-out operation. In the third embodiment of the present invention, as shown by the operational timing chart in FIG. 13, the same effect of the first embodiment and the second embodiment can be obtained when the write-in operation is carried out in synchronism with the falling edge of the clock signal CK in the unused cycle (cycle 3), namely in the previous cycle of the write-in cycle (cycle 4 and cycle 5). In this case, a write-in data is latched on the bit line pair BL and BLB at the falling edge (timing t30) of the clock signal CK. Then, the write-in data on the bit line pair BL and BLB is transmitted to and stored into a memory cell selected by the section word line SWL1 at timing t33 in synchronism with the rising edge (timing t32) of the clock signal CK.

As outlined in the foregoing explanation, in the present invention, the section word lines are selected and deselected by individual timing, not by same timing. When the selected word line is deselected within one access cycle such as a read-out cycle and a write-in cycle, prior to commencing the next access cycle, all the word lines are temporarily put in the deselected state so that duplication of selection of the word lines is avoided, and it is possible to prevent erroneous operation and delay in access time.

Also, the drive ability for selecting the word line and the drive ability for deselecting the word line do not have to be the same, therefore it is possible to have a small sized decoder and fast access time.

In addition, the write-in data can be input without waiting for the selection of the word line so that the write-in operation can be carried out high speed. It is also possible to prevent delay of the read-out at after the write-in.

Figure 14:
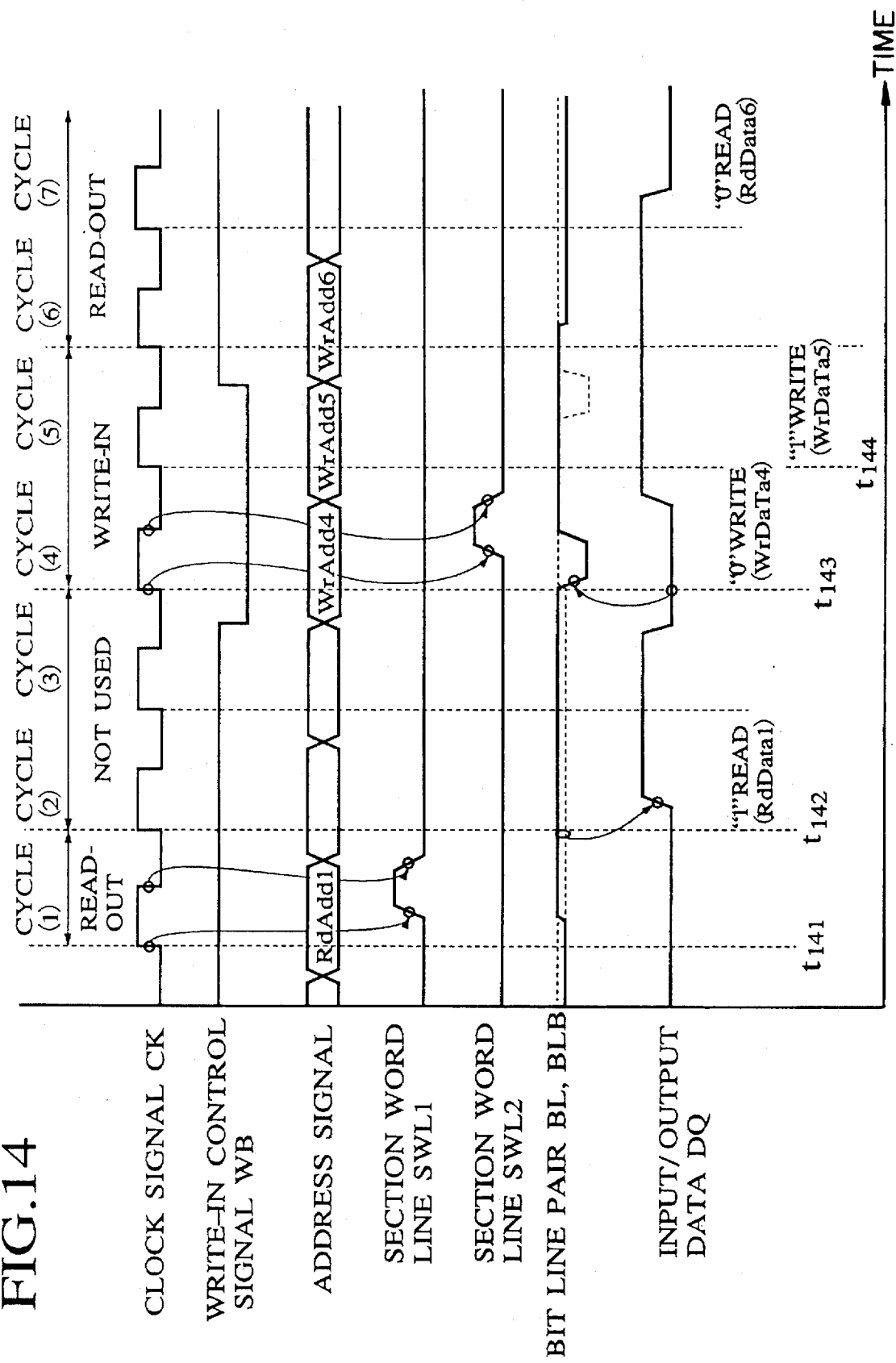
FIG. 14 is an operation timing chart for a synchronous-type memory based on the R/R method as the fourth embodiment of the present invention.

The present invention can also be applied to a synchronous-type memory based on the register/register method (R/R method) as a fourth embodiment of the present invention shown in FIG. 14.

FIG. 14 is an operation timing chart of a synchronous-type memory base on the R/R method. In this case, the section word line SWL1 is selected at the first rising edge (timing t141) of the clock signal CK, and the section word line SWL1 is deselected at the second rising edge (timing t142) of the clock signal CK during a read-out operation. In a write-in operation, the section word line SWL2 is selected after the first rising edge (timing t143) of the clock signal CK, and the section word line SWL2 is deselected before the second rising edge (timing t144) of the clock signal CK during a read-out operation. The decoder shown in FIG. 9 and the sense amplifier shown in FIG. 10 can also be used for the synchronous-type memory based on the R/R method as the fourth embodiment.

Thus, the features of the first to third embodiments described above can be obtained for the synchronous-type memory based on the R/R method.

While the above provides a full and complete disclosure of the preferred embodiments of the present invention, various modifications, alternate constructions and equivalents any be employed without departing from the true spirit and scope of the invention. Therefore the above description and illustration should not be construed as limiting the scope of the invention, which is defined by the appended claims.

What is claimed is:

1. A synchronous-type memory performing in synchronization with a clock signal having rising edges and falling edges provided from an external device, comprising:
   a plurality of memory cells for storing data, and selected by one of a plurality of word lines;
   decoder means for latching an address signal in order to select one of said word lines in accordance with one of said rising edges and falling edges of said clock signal, selecting said one word line, and deselecting said one word line in accordance with a subsequent and consecutive edge with respect to said one of said rising edges and falling edges of said clock signal;
   store means for storing said data transferred from said one word line selected by said decoder means in synchronism with said one of said rising edges and falling edges of said clock signal before all of said word lines are switched by the decoder means to a deselected state, synchronized with the subsequent and consecutive edge with respect to said one of said rising edges and falling edges of said clock signal.

2. A synchronous-type memory as claimed in claim 1, wherein said decoder means comprises a bipolar transistor located between a high level power source and an output terminal, and a field effect transistor (FET) connected between a lower level power source and said output terminal,
   wherein said decoder means selects one of said word lines corresponding to said address signal by means of said bipolar transistor, and deselects said selected word line in synchronism with the subsequent and consecutive edge of another one of said rising edges and falling edges of said clock signal.

3. A synchronous-type memory as claimed in claim 1, wherein said store means is formed by a sense amplifier.

4. A synchronous-type memory as claimed in claim 3 further comprising divider means for receiving said clock signal and generating an internal clock signal,
   wherein said decoder means and said sense amplifier operate in synchronism with said internal clock signal.

5. A synchronous-type memory, comprising:
   an address buffer for receiving an external address signal;
   a partial decoder and a main decoder for decoding the external address signal and controlling the selection of a word line;
   a cell group for storing data;
   first, second and third sense amplifiers connected in a series arrangement for sequentially performing sense-amplification of data read out from the cell group;
   an output buffer for transmitting the data supplied from the third sense amplifier;
   a write-in circuit for writing data into the cell group; and
   a clock buffer for inputting a clock signal CK, generating internal clock signals CK1, CK3, and CK5 having the same phase as the clock signal CK, and internal clock signals CK2B, CK3B, and CK5B having a phase which is opposite to that of the clock signal CK, and supplying the internal clock signal CK1 to the partial decoder, the internal clock signal CK2B to the main decoder, the internal clock signals CK3, CK3B to the third sense amplifier, and the internal clock signals CK5, CK5B to the write-in circuit,
   wherein a read-out operation or a write-in operation is performed for the data within one cycle of the clock signal CK only after the address becomes valid.

6. A synchronous-type memory as claimed in claim 5, wherein the main decoder includes:
   logic gates for latching the address signal which is synchronized with a rising edge of the internal clock signal CK,
   a first transistor, an ON state of which is controlled by an output from the partial decoder, and an output stage for driving a main word line MWL by a switching operation of a second transistor, an ON state of which is controlled by the internal clock signal CK2B, wherein when the internal clock signal CK1 synchronized with the rising edge of the internal clock signal CK is at a high level and the internal clock signal CK2 is at a low level, the first transistor is in the ON state and the second transistor is in an OFF state to select the main word line MWL, and the internal clock signal CK1 reaches the low level synchronized with a falling edge of the internal clock signal CK, the internal clock signal CK2B being at the high level, the first transistor being in an OFF state, the second transistor being in the ON state, and the main word line MWL is discharged by the second transistor.

7. A synchronous-type memory as claimed in claim 6, wherein the third sense amplifier includes third and fourth transistors and when the internal clock signal CK3 is at the high level and the internal clock signal CK2B is at the low level, the output of the first and second sense amplifiers is received, and the data is latched into the third sense amplifier, when the internal clock signal CK3 is at the low level and the internal clock signal CK3B is at the high level, the date stored in the third sense amplifier until that time is sense-amplified and is output to the output buffer, the data is then latched and stored.

8. A synchronous-type memory performing in synchronization with a clock signal, comprising:

decoding means for receiving an address signal and activating one of a plurality of word lines in synchronism with a first clock signal;

a plurality of memory cells connected to said decoding means for storing data which is selected by one of said word lines activated by said decoding means and outputting a data signal indicative of the selected data;

amplifying means connected to said memory cells for amplifying said data signal indicative of the selected data; and output means for outputting the selected data through I/O pins, wherein said decoding means deactivates, in synchronism with a second clock signal, said one of said word lines activated in synchronism with said first clock signal, said second clock signal has a phase which is the reverse of that of said first clock signal.

9. The synchronous-type memory performing in synchronization with a clock signal as claimed in claim 8 wherein said decoding means has an output circuit provided for each of said word lines, wherein said output circuit comprises a bipolar transistor and a field effect transistor connected in series with a connecting midpoint to which said each of said word lines is connected, wherein said bipolar transistor has a base receiving a word line selection signal in synchronism with said first clock signal, and wherein said field effect transistor has a gate receiving a word line deactivation signal in synchronism with said second clock signal.

10. The synchronous-type memory performing in synchronization with a clock signal as claimed in claim 9 wherein said output circuit further comprises another field effect transistor which is connected to the base of said bipolar transistor and has a gate receiving said word line deactivation signal in order to turn off said bipolar transistor in synchronism with said second clock signal.

11. The synchronous-type memory performing in synchronization with a clock signal as claimed in claim 10 wherein said word line deactivation signal is generated from said second clock signal through a pair of inverters.

* * * * *